United States Patent [19]

Milkovic

[11] Patent Number: 4,859,937
[45] Date of Patent: Aug. 22, 1989

[54] PULSE WIDTH MODULATOR IN AN ELECTRONIC WATT-HOUR METER WITH UP AND DOWN INTEGRATION FOR ERROR CORRECTION

[75] Inventor: Miran Milkovic, Schenectady, N.Y.
[73] Assignee: General Electric Company, Somersworth, N.H.
[21] Appl. No.: 70,794
[22] Filed: Jul. 7, 1987
[51] Int. Cl.$^4$ .................... G08C 19/22; G01R 21/127
[52] U.S. Cl. ..................................... 324/142; 307/265
[58] Field of Search .................. 324/142; 340/870.24, 340/347 M; 364/842; 307/265

[56] References Cited

U.S. PATENT DOCUMENTS

| | | | |
|---|---|---|---|
| 4,217,546 | 8/1980 | Milkovic | 324/142 |
| 4,315,212 | 2/1982 | Gamoh | 324/142 |
| 4,463,311 | 7/1984 | Kobayashi | 324/142 |
| 4,495,463 | 1/1985 | Milkovic | 324/142 |
| 4,535,287 | 8/1985 | Milkovic | 324/142 |

Primary Examiner—Jerry Smith
Assistant Examiner—Stephen M. Baker
Attorney, Agent, or Firm—Robert E. Brunson; Thomas R. Morrison

[57] ABSTRACT

Apparatus for producing a pulse width modulated signal in response to a current signal related to a current or a voltage in an electric system. A series resistor in series with a signal voltage proportional to the current or voltage in the system converts the signal voltage into the current signal. An integrator includes an operational amplifier with an integrating capacitor connected between an output and a first input thereof, producing a virtual ground at an input of the integrator. The series resistor is connected to the virtual ground. A second operational amplifier has a first input receiving an output of the integrator. A first bi-polarity trigger receives the output of the second operational amplifier. A resistive voltage divider is connected to an output of the first bi-polarity trigger, and a junction of the resistive voltage divider is connected to a second input of the second operational amplifier, so that a positive and a negative voltage at the junction provides first and second threshold voltages for the second operational amplifier. A second inverting bi-polarity trigger receives the output of the first bi-polarity trigger. A resistor receives an output voltage from the second inverting bi-polarity trigger and converts the output voltage to a second current signal. The second current signal is connected to the virtual ground so that an integration rate in the integrator is increased or decreased in proportion to an amplitude of the first current signal and a pulse width modulated signal is produced.

1 Claim, 4 Drawing Sheets

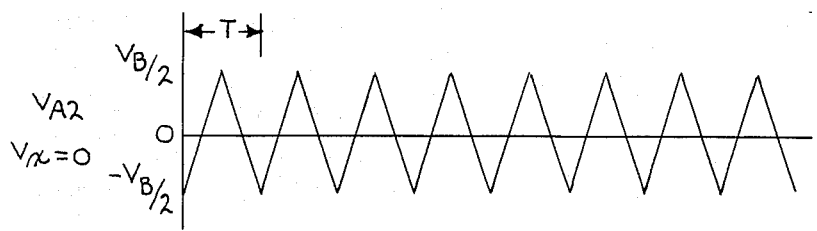
FIG.4A
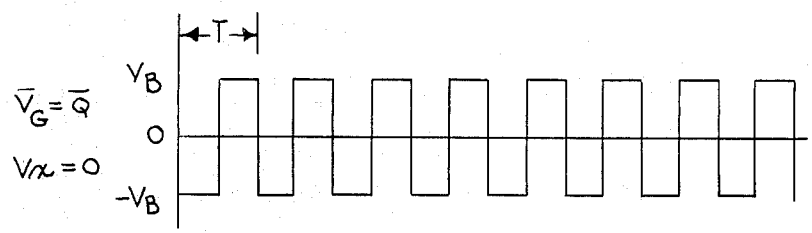
FIG.4B
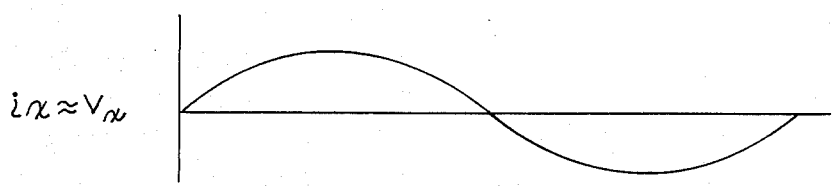
FIG.4C
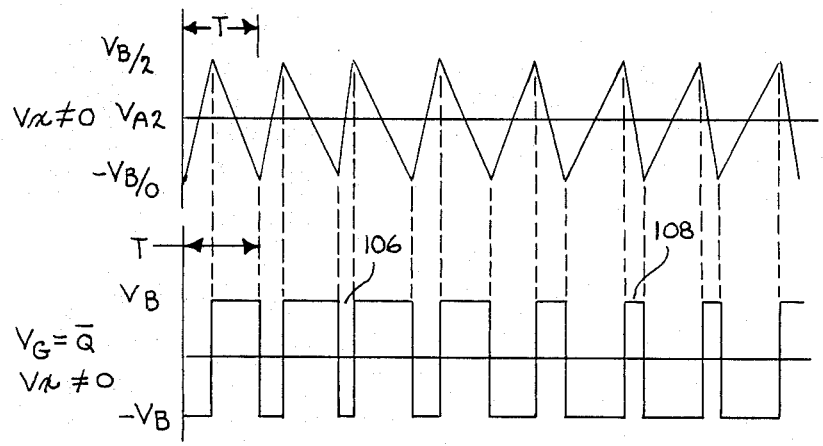
FIG.4D
FIG.4E
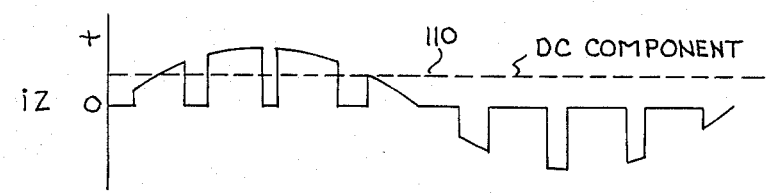
FIG.4F

PULSE WIDTH MODULATOR IN AN ELECTRONIC WATT-HOUR METER WITH UP AND DOWN INTEGRATION FOR ERROR CORRECTION

BACKGROUND OF THE INVENTION

The present invention relates to electronic energy consumption metering and, more particularly, to electronic metering of electric energy consumption in which the direction of integration is periodically reversed in order to cancel out offset errors.

Metering of electric energy consumption employs measurements of electric current and voltage fed to a load and multiplication of the measured quantities to determine the instantaneous power usage. The multiplied values are integrated over time in a register to record the energy consumed. Electromechanical watt-hour or kilowatthour meters conventionally employ a conductive disk rotated as the rotor of a small induction motor by the interaction of flux fields from both a voltage stator connected across the energy supply and a current stator connected in series with the load. The rotations of the disk are integrated in a geared mechanism for recording the energy used.

Electro-mechanical watthour meters require precision manufacture which limits the amount by which their cost can be reduced. In addition, electro-mechanical devices are inherently less reliable than devices having no moving parts.

In my prior U.S. Pat. Nos. 3,955,138; 4,066,960; 4,485,343 and 4,495,463, (the disclosures of which are herein incorporated by reference), I disclose techniques for electronic energy consumption metering which employ time-division or amplitude-markspace modulation for multiplying an analog variable related to instantaneous current by an analog variable related to instantaneous voltage. The multiplied resulting signal contains a DC component, representing the desired power measurement, and an AC component which is removed by filtering. The DC component is integrated until the integrated value attains a threshold, at which time a change of state in the output of the metering device indicates that the consumption of a predetermined quantum of electric energy has occurred.

The multiplication of the two analog variables is achieved by alternately switching the polarity of one of the analog variables in response to a control signal which is pulse-width modulated by the other analog variable. The result is a pulse train whose height is responsive to one of the variables and whose instantaneous pulse width is responsive to the other analog variable. Accordingly, the average or DC component of the resultant width and amplitude modulated pulse train is proportional to power consumption.

The pulse-width modulator in each of the foregoing patents employs a comparator for measuring the time at which the voltage signal passes a predetermined reference voltage. Thus, the accuracy with which the pulse width is controlled is dependent upon the accuracy of the reference voltage. In addition, each of these prior devices requires that at least one of the analog signals be a balanced, double-ended signal. A balanced, double-ended signal is conveniently generated using a center-tapped transformer. Such a center-tapped transformer is expensive and its elimination is thus desirable. Furthermore, it is desirable to reduce the amount of power consumed by the metering equipment. This indicates that solid state devices, and preferably low-power-consumption, solid state devices should be used. One desirable type of solid state device presently available is a complimentary metal oxide semiconductor (CMOS). The circuits of the above-referenced patents are not efficiently implemented in CMOS technology.

OBJECTS AND SUMMARY OF THE INVENTION

Accordingly, it is an object of the invention to provide an electronic metering apparatus which overcomes the drawbacks of the prior art.

It is a further object of the invention to provide an electronic metering apparatus which requires single-ended signals for both its current and voltage analog variables.

It is a still further object of the invention to provide an electronic metering apparatus which employs varying integration times for controlling the pulse-width ratio of a constant-frequency oscillator.

It is a still further object of the invention to provide a pulse-width modulator for an electric meter which produces a substantially constant-frequency pulsed signal having a ratio of positive to negative portions dependent upon the amplitude of a current signal.

Briefly stated, the present invention provides an electronic watthour meter employing a first analog signal representing either a load current or voltage to pulse-width-modulate a second analog signal representing the other of the load current or voltage. The resulting signal contains a DC component proportional to the product of current and voltage. AC components are removed from the product signal in an integrator before applying the DC component to a threshold circuit. The threshold circuit alternates its output between positive and negative values each time the DC component of the product signal passes through a predetermined positive and negative value. Each cycle of this pulsed signal is indicative of the consumption of a predetermined quantum of electric energy. The pulsed signal is transmitted to a register for integrating the energy usage. A pulse-width modulator produces a constant-frequency pulsed output whose positive and negative alternations have lengths which differ in proportion to the line signal it receives. At each alternation of the pulsed signal, the output of the pulse-width modulator alternates between a direct and an inverted signal. Thus, integration is driven in alternate directions, whereby offset voltages of active circuits are balanced out.

According to an embodiment of the invention, there is provided an electronic meter for measuring energy consumption in an electrical system comprising means for generating a first analog current signal responsive to a current in the system, means for generating a second analog current signal responsive to a voltage in the system, a pulse-width modulator responsive to one of the first and second analog current signals for producing a first substantially constant-frequency, pulse-width-modulated signal having a ratio of positive to negative portions related to an amplitude of the one of the first and second analog current signals, an integrator, a first switch effective, when energized, to connect the other of the first and second analog current signals to the integrator, means for energizing the first switch during one of the positive and negative portions and for deenergizing the first switch during the other of the positive and negative portions, whereby an output of the first switch includes a product of the first and second analog current signals and an output of the integrator includes an average component of the product, a threshold circuit, the threshold circuit including means for changing between first and second conditions of its output each time an output of the integrator attains a first predetermined positive value and a second predetermined negative value, means for generating a complement of the substantially constant-frequency, pulse-width-modulated signal having a ratio of positive to negative portions inversely related to an amplitude of the one of the first and second analog current signals, a second switch, the second switch including means responsive to the first condition of the output of the threshold circuit for applying the pulse-width-modulated signal to the first switch, and further responsive to the second condition of the output of the threshold circuit for applying the complement to the first switch, whereby the integrator alternately integrates in a positive and a negative direction, and the first and second conditions of the output of the threshold circuit being indicative of a predetermined quantum of energy consumption in the system.

According to a feature of the invention, there is provided apparatus for producing a pulse-width-modulated signal in response to a current signal related to a current or a voltage in an electric system comprising a signal generator, the signal generator including means for producing a signal voltage proportional to the current or voltage, a series resistor in series with the signal voltage effective for converting the signal voltage into a first current signal, an integrator, the integrator including an operational amplifier with an integrating capacitor connected between an output and a first input thereof, whereby a gain in the operational amplifier is effective to produce a virtual ground at an input of the integrator, the series resistor being connected to the virtual ground, the operational amplifier having a first input receiving an output of the integrator, a first bi-polarity trigger receiving the output of the operational amplifier, a resistive voltage divider on an output of the first bi-polarity trigger, a junction of the resistive voltage divider being connected to a second input of the operational amplifier, whereby a positive and a negative voltage at the junction provides first and second threshold voltages for the operational amplifier, a second inverting bi-polarity trigger receiving the output of the first bi-polarity trigger, a resistor receiving an output voltage from the inverting bi-polarity trigger and effective to convert the output voltage to a second current signal, and means for connecting the second current signal to the virtual ground whereby an integration rate in the integrator is increased or decreased in proportion to an amplitude of the first current signal and a pulse-width-modulated signal is produced.

The above, and other objects, features and advantages of the present invention will become apparent from the following description read in conjunction with the accompanying drawings, in which like reference numerals designate the same elements.

BRIEF DESCRIPTION OF THE DRAWINGS

FIGS. 4A–4F are curves to which reference will be made in explaining the operation of the invention.

DETAILED DESCRIPTION OF THE PREFERRED EMBODIMENT

Figure 1:
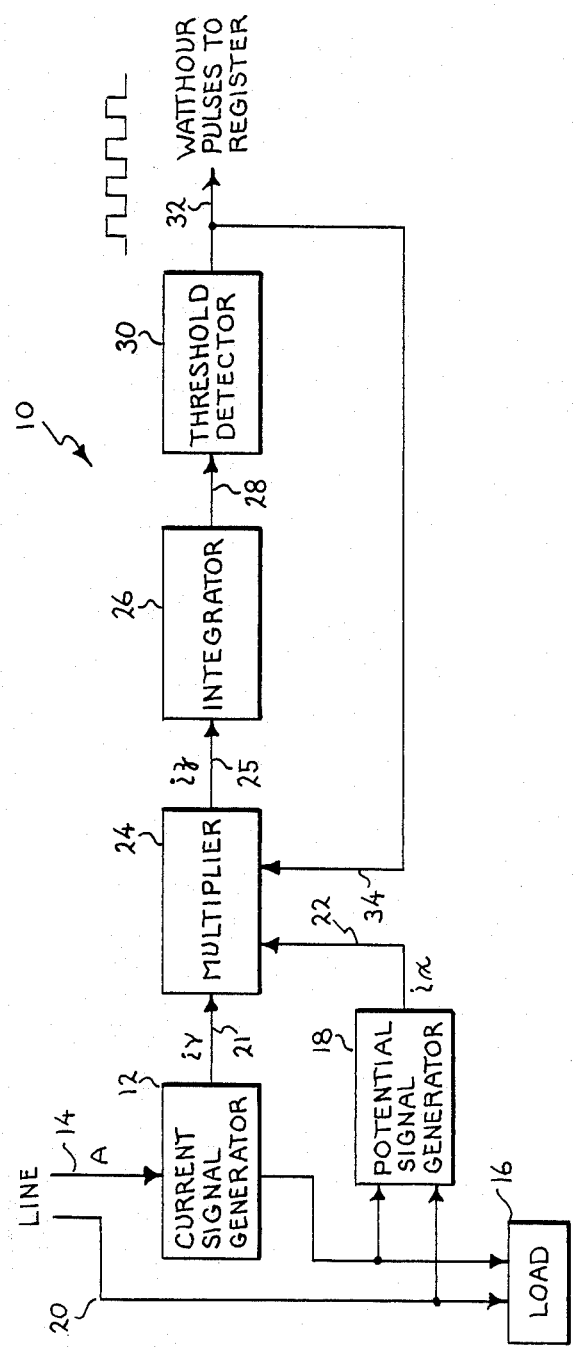
FIG. 1 is a simplified block diagram of an electronic watthour metering circuit according to an embodiment of the invention.

Referring to FIG. 1, there is shown, generally at 10, an electronic watthour metering circuit according to an embodiment of the invention. A current signal generator 12 produces an analog current signal iy in response to a current A on a line 14 being consumed by a load 16. A potential signal generator 18 produces an analog potential signal ix in response to a voltage existing between line 14 and a line 20 connected to load 16.

Current signal iy and potential signal ix are connected on lines 21 and 22, respectively, to inputs of a multiplier 24. Multiplier 24 pulse-width-modulates one of its two inputs in a width ratio dependent upon the other of its inputs. For example, the current signal iy may be pulse-width modulated in response to the amplitude of the potential signal ix, or vice versa. The resulting product signal iz, containing both AC and DC components, is fed on a line 25 to a integrator 26. The DC component containing the information regarding power consumption is integrated in integrator 26 to remove the AC component and the result is passed on a line 28 to a threshold circuit 30.

Threshold circuit 30 detects the slowly varying DC signal from integrator 26, first in one direction, and then in the other direction continually reversing the direction of integration when a predetermined positive and negative threshold is reached. During upward and downward integration, a positive or negative output pulse is applied to an output line 32. If the positive and negative thresholds are equal and if multiplier 24, integrator 26 and threshold circuit 30 exhibit no offset voltage (i.e. a non-zero output voltage or current in response to a zero input voltage or current), each cycle of positive and negative pulses of the output signal on output line 32 would be an accurate indication of the consumption of a predetermined quantum of electricity such as, for example, a watthour or kilowatthour. When accumulated, or counted, in a register (not shown), the energy consumed is made available for billing or other purposes.

It is a fact, however, that active electronic circuits do exhibit offset voltages. In order to overcome such offset voltage, some of my prior patents, as well as the present invention, integrate first in one direction, and then in the other direction. Any errors produced by offset voltages while integrating in one direction are counterbalanced by equal and opposite errors while integrating in the opposite direction. In order to accomplish such bi-directional integration, my prior patents required comparatively complex electronic switching devices, as well as at least one center-tapped transformer in their counterpart of current signal generator 12 or potential signal generator 18. Such complexity adds undesirably to the cost of the device.

A sample of the output signal on output line 32 is fed back on a feedback line 34 to multiplier 24. For a given condition of power consumption, multiplier 24 produces a product signal iz having a positive DC component during one condition of the output signal fed back on feedback line 34 and a product signal iz having a negative DC component during the other condition of the output signal. In this manner, integrator 26 is forced to integrate first in one direction until the first predetermined threshold in threshold circuit 30 is attained, and then in the opposite direction until the second predetermined threshold in threshold circuit 30 is attained. Thus, offset errors are cancelled.

Figure 2:
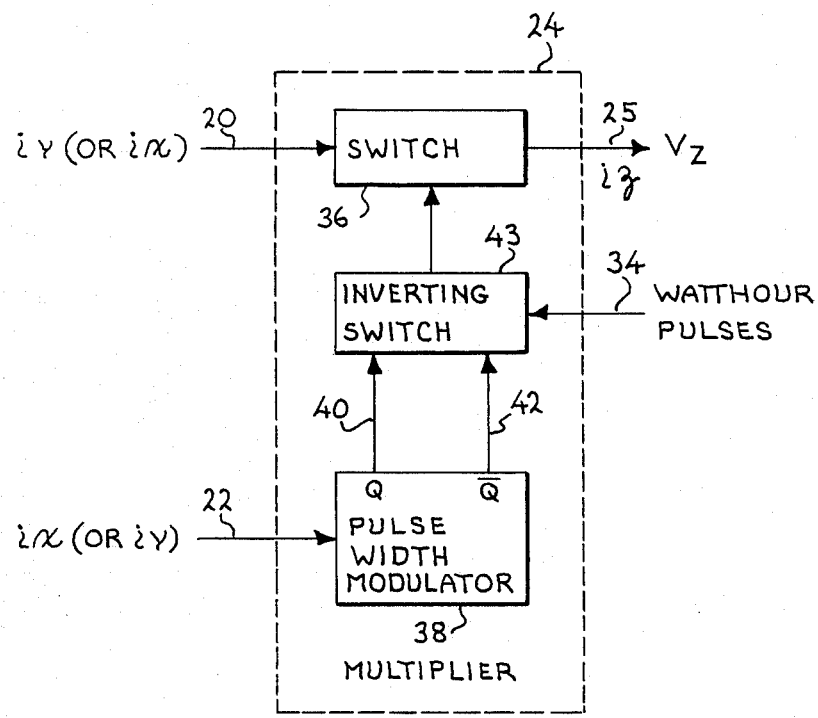
FIG. 2 is a block diagram of a multiplier of the electronic watthour metering circuit of FIG. 1.

Referring now to FIG. 2, it should be noted that the current and voltage signals iy and ix are interchangeable. Thus, analog current signal iy (or potential signal ix) on line 20 is connected to a switch 36 in multiplier 24. Analog potential signal ix (or current signal iy) on line 22 is connected to a pulse-width modulator 38. Pulse-width modulator 38 produces a direct output Q on a first line 40 and an inverted output QBAR on a second line 42. The direct and inverted outputs of pulse-width modulator 38 are applied to an inverting switch 43. During one condition of the output pulses fed back on feedback line 34, inverting switch 43 uses the direct output Q of pulse-width modulator 38 for controlling switch 36, whereas during the other condition of the output signal, inverting switch 43 uses the inverted output of QBAR pulse-width modulator 38 for controlling switch 36.

Figure 3:
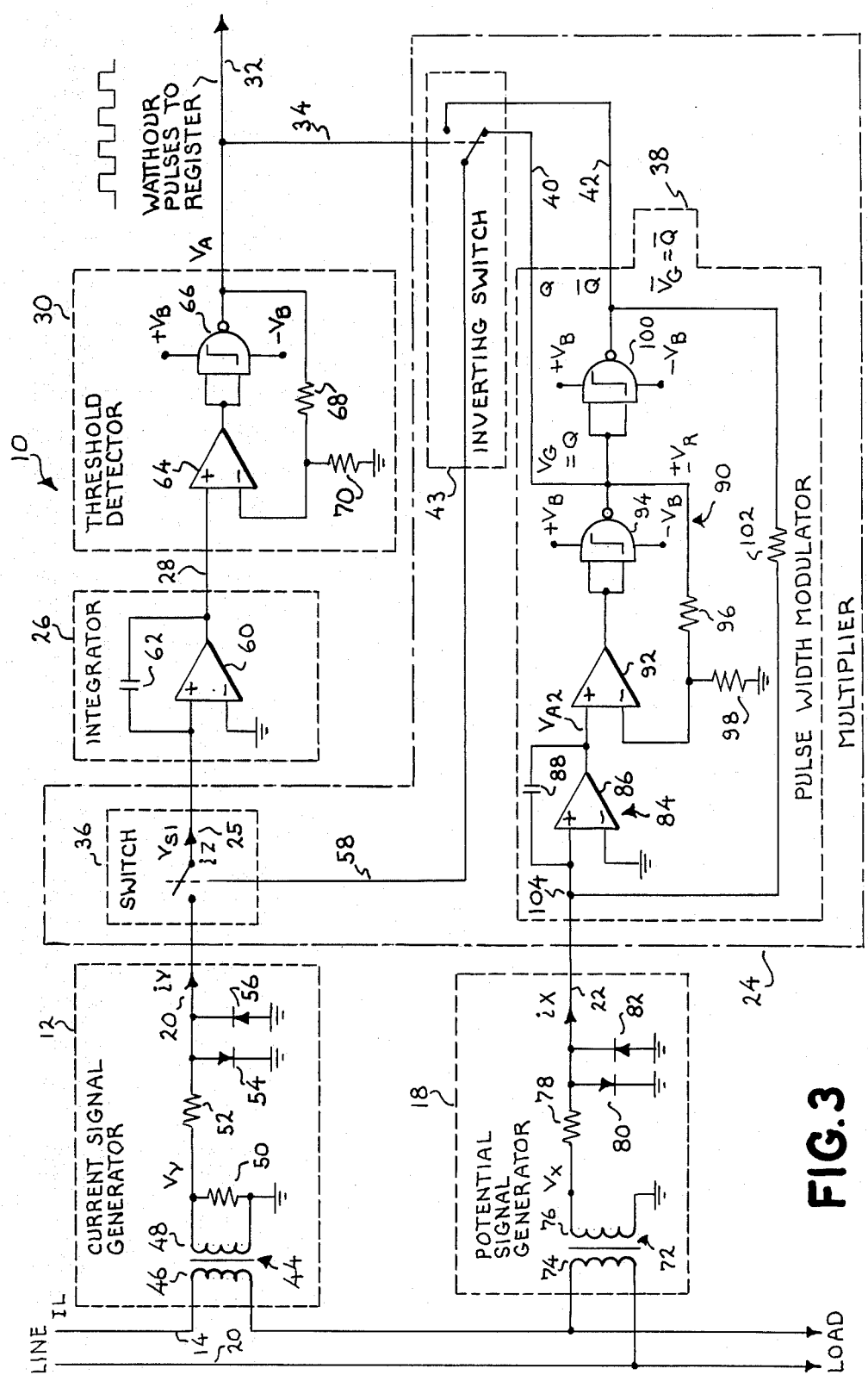
FIG. 3 is a detailed schematic and block diagram of the electronic watthour metering circuit of FIG. 1.

Referring now to FIG. 3, current signal generator 12 includes a current transformer 44 having a primary winding 46 connected in series with a load current IL. A voltage Vy, proportional to the load current, is induced in a secondary winding 48. A loading resistor 50, of low resistance compared to the impedance of the downstream circuits, is connected across secondary winding 48. The resistance of loading resistor 50, which may be, for example, about 50 to 100 ohms, controls the value of the voltage Vy independently of changes in the impedances of the downstream circuits. A full development of the theory and benefits of loading resistor 50 are contained in my prior U.S. Pat. No. 3,955,138.

A series resistor 52 generates current signal iy which is connected to one terminal of switch 36. Series resistor 52 forms the effective load in parallel with loading resistor 50, and its resistance is therefore chosen to be substantially larger than the resistance of loading resistor 50. Oppositely poled diodes 54 and 56 protect against voltage spikes.

Switch 36 includes a single-pole, single-throw switch receiving the current signal iy at its input, and connecting the product signal iz to line 25 at its output. The open and closed condition of switch 36 is controlled by a control signal on a control line 58. The production of the control signal will be detailed hereinafter.

Integrator 26 contains an operational amplifier 60 having an integrating capacitor 62 connected between its input and output. As is well known, the high gain of operational amplifier 60 forces it to produce a signal on line 28 having a sufficient voltage which, when reflected back through integrating capacitor 62, places a virtual ground condition at its input. As a consequence, the current signal iy is equal to vy/R52.

The rate at which the output voltage of operational amplifier 60 can increase is controlled by the average value of the product signal iz fed thereto. Thus, the slope of the signal on line 28 fed to threshold circuit 30 depends on the average value of the product signal iz.

Threshold circuit 30 contains a comparator 64 and a bi-polarity trigger 66 with resistors 68 and 70 connected in series from the output of bi-polarity trigger 66 to ground. A reference voltage VR is connected from the junction of resistors 68 and 70 to a second input of comparator 64. Bi-polarity trigger 66 receives a positive reference voltage +VB and a negative reference voltage −VB. In response to an input signal even slightly positive, the output of bi-polarity trigger 66 almost immediately switches to −VB less a small voltage drop in bi-polarity trigger 66. Similarly, in response to an input signal even slightly negative, the output of bi-polarity trigger 66 switches to +VB less a slight voltage drop in bi-polarity trigger 66. At the junction of resistors 68 and 70, the voltage swings between VA(R70/(R68+R70)). For convenience, if R68=R70, then the voltage at the junction of resistors 68 and 70 swings between VA/2 and −VA/2. When the signal on line 28 passes through VA/2 in the positive-going direction, or through −VA/2 in the negative-going direction, comparator 64 reverses its output polarity and thus reverses the output polarity of bi-polarity trigger 66. In this manner, the output on output line 32 alternates between +VB and −VB.

Potential signal generator 18 includes a potential transformer 72 having a primary winding 74 connected across lines 14 and 20 and a secondary winding 76 having a first end connected to ground and a second end connected to a series resistor 78. Oppositely poled diodes 80 and 82 are connected from the downstream end of series resistor 78 to ground for circuit protection.

Pulse-width modulator 38 includes an integrator 84 consisting of an operational amplifier 86 and an integrating capacitor 88 connected between the output and the input thereof. Due to the high gain of operational amplifier 86, the signal VA2 of operational amplifier 86 rises to a value which, when reflected to its input through integrating capacitor 88, is effective to place a virtual ground at the input to integrator 84. The rate at which the output voltage of integrator 84 changes is determined by the current available at its input. Two sources of such current are available, as will be described.

A threshold circuit 90 contains a comparator 92 receiving signal VA2 at a first input thereof. A bi-polarity trigger 94 receives the output of comparator 92. Resistors 96 and 98 are connected in series from the direct output Q of inverting switch 43 to ground with a voltage +/−VR at the junction of resistors 96 and 98 connected back to a second input of comparator 92. If R96=R98, then VR varies between + and −VB/2. The direct output Q of threshold circuit 90 which varies between approximately +VB and −VB is connected to the input of an inverting bi-polarity trigger 100 which produces the inverted output QBAR having opposite polarity to the direct output Q. The inverted output QBAR is connected through a resistor 102 to a summing point 104 at the input of integrator 84. The direct output Q and inverted output QBAR of pulse-width modulator 38 are connected on lines 40 and 42 to terminals of inverting switch 43. The output signal fed back on feedback line 34 alternately switches between the direct output Q and inverted output QBAR for connection to control line 58 on each half cycle of the output signal.

Summing point 104 is maintained at virtual ground at all times by the voltage fed back from the output of operational amplifier 86 to its input through integrating capacitor 88. Thus, the voltage at summing point 104 remains extremely close to zero regardless of the voltage at the upstream ends of series resistor 78 and resistor 102. Thus the currents through these resistors is controlled solely by the voltages at their upstream ends and by the values of the two resistances. As a consequence, the current passing through series resistor 78 into summing point 104 is independent of the current passing through resistor 102, and vice versa. The total current fed to integrator 84, which controls the rate at which the output voltage of operational amplifier 86 changes, is the superposition of the two currents (Vx/R78)+(QBAR/R102).

The polarity of the inverted output signal QBAR reverses each time the signal VA2 of integrator 84 reaches +−VR/2 (assuming that R96=R98).

If zero voltage exists between lines 14 and 20, the potential signal ix is zero. Thus, the current at summing point 104 is equal to QBAR which alternates between +VB and −VB. Given that +VB=−(−VB), then the upward and downward integration times in integrator 84 should be substantially equal and direct output signal Q and inverted output signal QBAR should be symmetrical with a period T. These relationships are illustrated in FIGS. 4A and 4B.

When the potential signal ix is not zero, but instead varies as indicated in FIG. 4C, the current at summing point 104 is not wholly determined by the current fed back through resistor 102, but instead, is the summation of currents through resistor 102 and series resistor 78. During a positive half cycle of the potential signal ix, the total current fed to summing point 104 is increased by an amount Vx/R78. As a consequence, during a positive alternation of potential signal ix, the rate at which signal VA2 of integrator 84 changes in the upward direction is proportionately increased and the rate at which it changes in the downward direction is proportionately decreased. This is illustrated in FIG. 4D wherein the slopes of the positive-going portions of the signal VA2 are steeper than the negative-going portions.

During the illustrated negative half cycle of potential signal ix, the opposite integration speeds occur. That is, the potential signal current subtracts from positive alternations of the signal fed to summing point 104 through resistor 102 and adds in the negative direction during negative alternations of the signal through resistor 102. As a consequence, the pulse widths of the signals Q and QBAR during a particular portion of a positive half cycle of the potential signal ix are the inverses of the pulse widths during corresponding portions of the negative half cycle. As shown in FIG. 4E, a negative cycle 106 during the positive half cycle of potential signal ix (FIG. 4C) has the same width as a positive cycle 108 during a corresponding time in the negative half cycle of potential signal ix.

The steepening of the slopes of the positive-going portions of the signal VA2 by a positive potential signal ix is equalled by the shallowing of the slopes of the negative-going portions of the signal VA2 by the same positive potential signal ix. As a consequence, the total period T remains constant. However, the different slopes of signal VA2 during positive-going and negative-going integration cause the threshold values in comparator 92 to be reached earlier or later. As a consequence, threshold circuit 90 switches its output between positive and negative values at times which are advanced or retarded in proportion to the value of potential signal ix.

Although FIGS. 4A–4E illustrate only a few cycles of signals Q and QBAR during a cycle of the potential signal ix, in fact, a much larger number of cycles of Q and QBAR per cycle of potential signal ix is preferred. In the preferred embodiment, with a line frequency of about 60 Hz, a frequency of about 5 KHz is preferred for Q and QBAR.

Referring now also to FIG. 3, when, for example, the QBAR signal controls switch 36, product signal iz appears as shown in FIG. 4F. Positive alternations of the QBAR signal, which are effective to close switch 36, have a higher duty cycle during positive half cycles of the potential and current signals ix and iy, respectively, than they do during the negative half cycles of these signals. Thus, a positive DC component, indicated by a dashed line 110, exists in the product signal iz at this time. As a consequence, integrator 26 integrates in the negative-going direction until its output voltage reaches −VR. Then, the output of threshold circuit 30 changes polarity thus producing an alternation of the output signal on output line 32, and also reverses inverting switch 43, whereby inverted output QBAR is removed from control of switch 36 and the direct output Q is substituted therefore. Since switch 36 is now controlled by the complement of the signal previously employed, the DC component of the product signal is equal to the negative of the DC component illustrated in FIG. 4F. Thus, integrator 26 begins to integrate in the upward direction until the reference voltage +VR is attained. Then the output voltage of threshold circuit 30 is again switched and the cycle is repeated.

The watthour pulses on output line 32 occur at a relatively low frequency compared to either the line frequency or the frequency of Q and QBAR, although their frequency depends on the instantaneous power consumption, a frequency of the order of, for example, from a fraction of a Hz to a few Hz may be expected. Thus, many cycles of the line frequency are processed for each watthour cycle.

To minimize the sensitivity of electronic watthour metering circuit 10 variations in reference voltages +−VB, the resistance of resistor 102 is preferably made equal to the resistances of resistors 96 and 98. Due to the low power consumption of CMOS circuits, from which the preferred embodiment is constructed, a low-cost, high-accuracy reference power supply (not shown) may be operated using, for example, power taken in parallel with potential transformer 72.

Electronic watthour metering circuit 10 may be constructed in any desired manner. The invention is, however, conceived for easy integration onto a single chip, and such is considered to be the most preferred embodiment.

Although electronic watthour metering circuit 10 is described in the environment of a single-phase power system, it would be clear to one skilled in the art that metering of a polyphase power system can be performed with additional apparatus corresponding to that disclosed above. The relationship between single-phase and three-phase electronic power metering can be seen in a comparison of my prior U.S. Pat. Nos. 3,955,138 (single phase) and 3,875,509 (corresponding three phase).

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. Apparatus for producing a pulse-width-modulated signal in response to a current signal related to a current or a voltage in an electric system comprising:
   a signal generator;

said signal generator including means for producing a signal voltage proportional to said current or voltage;

a series resistor in series with said signal voltage effective for converting said signal voltage into a first current signal;

an integrator;

said integrator including an operational amplifier with an integrating capacitor connected between an output and a first input/thereof, whereby a gain in said operational amplifier is effective to produce a virtual ground at an input of said integrator;

said series resistor being connected to said virtual ground;

a second operational amplifier having a first input receiving an output of said integrator;

a first bi-polarity trigger receiving said output of said second operational amplifier;

a resistive voltage divider on an output of said first bi-polarity trigger;

a junction of said resistive voltage divider being connected to a second input of said second operational amplifier, whereby a positive and a negative voltage at said junction provides first and second threshold voltages for said second operational amplifier;

a second inverting bi-polarity trigger receiving said output of said first bi-polarity trigger;

a resistor receiving an output voltage from said second inverting bi-polarity trigger and effective to convert said output voltage to a second current signal; and means for connecting said second current signal to said virtual ground, whereby an integration rate in said integrator is increased or decreased in proportion to an amplitude of said first current signal and a pulse-width-modulated signal is produced.

* * * * *